(12) United States Patent
Chang et al.

(10) Patent No.: US 10,593,837 B2
(45) Date of Patent: Mar. 17, 2020

(54) LIGHT EMITTING DEVICE WITH A STEPPED STRUCTURE

(71) Applicant: Au Optronics Corporation, Hsinchu (TW)

(72) Inventors: Cheng-Chieh Chang, Kaohsiung (TW); Wen-Wei Yang, Changhua County (TW); Cheng-Yeh Tsai, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/016,681

(22) Filed: Jun. 25, 2018

(65) Prior Publication Data

US 2019/0067522 A1    Feb. 28, 2019

(30) Foreign Application Priority Data

Aug. 28, 2017  (TW) .............................. 106129200 A

(51) Int. Cl.
*H01L 33/00* (2010.01)
*H01L 33/38* (2010.01)
(Continued)

(52) U.S. Cl.
CPC ............ *H01L 33/38* (2013.01); *H01L 27/156* (2013.01); *H01L 33/20* (2013.01); *H01L 33/385* (2013.01);
(Continued)

(58) Field of Classification Search
CPC ....... H01L 33/62; H01L 27/156; H01L 33/44; H01L 33/06; H01L 2933/0025;
(Continued)

(56) References Cited

U.S. PATENT DOCUMENTS 8,796,053 B2    8/2014  Hawryluk et al.
8,847,256 B2 *  9/2014  Han ........................ H01L 33/20
                                              257/98

(Continued)

FOREIGN PATENT DOCUMENTS

CN    203503683    3/2014
CN    104332538    2/2015
(Continued)

OTHER PUBLICATIONS

"Office Action of China Counterpart Application," dated Jan. 14, 2019, p. 1-p. 6.

*Primary Examiner* — Ismail A Muse
(74) *Attorney, Agent, or Firm* — JCIPRNET

(57) ABSTRACT

A light emitting device including a first semiconductor layer, a light emitting layer, a second semiconductor layer, a first electrode, and a second electrode is provided. The light emitting layer is deposited between the first and the second semiconductor layers. The first semiconductor layer, the light emitting layer and the second semiconductor layer form a stepped structure including a first electrode connection surface, a second electrode connection surface, and a connection portion. The first electrode connection surface is located on the first semiconductor layer. The second electrode connection surface is located on the second semiconductor layer. The connection portion connects the first and the second electrode connection surfaces. The connection portion includes a first surface, a second surface, and a third surface. A first corner s formed between the first and the second surfaces. A second corner is formed between the second and the third surfaces.

13 Claims, 9 Drawing Sheets

(51) Int. Cl.
  H01L 33/44 (2010.01)
  H01L 27/15 (2006.01)
  H01L 33/62 (2010.01)
  H01L 33/20 (2010.01)
  *H01L 33/32* (2010.01)
  *H01L 33/06* (2010.01)
  *H01L 25/075* (2006.01)

(52) U.S. Cl.
  CPC .............. *H01L 33/44* (2013.01); *H01L 33/62* (2013.01); *H01L 25/0753* (2013.01); *H01L 33/0075* (2013.01); *H01L 33/06* (2013.01); *H01L 33/32* (2013.01); *H01L 2933/0016* (2013.01); *H01L 2933/0025* (2013.01)

(58) Field of Classification Search
  CPC ................. H01L 33/0075; H01L 33/32; H01L 2933/0016; H01L 33/38
  See application file for complete search history.

(56) References Cited

U.S. PATENT DOCUMENTS

| | | | |
|---|---|---|---|
| 9,312,434 | B1 | 4/2016 | Shu et al. |
| 9,705,037 | B2 | 7/2017 | Kang et al. |
| 10,056,535 | B2 | 8/2018 | Chang et al. |
| 2005/0104080 | A1* | 5/2005 | Ichihara ................. H01L 33/32 257/98 |
| 2006/0284195 | A1* | 12/2006 | Nagai ...................... F21K 9/00 257/98 |
| 2006/0284205 | A1* | 12/2006 | Liu ......................... H01L 33/08 257/98 |
| 2007/0262342 | A1* | 11/2007 | Kobayashi ............ H01L 33/007 257/103 |
| 2010/0163906 | A1* | 7/2010 | Hong ..................... H01L 33/20 257/98 |
| 2010/0224899 | A1 | 9/2010 | Kang et al. |
| 2012/0153323 | A1 | 6/2012 | Hawryluk et al. |
| 2014/0048767 | A1* | 2/2014 | Kusunoki ............... H01L 33/06 257/13 |
| 2014/0183572 | A1* | 7/2014 | Kim ..................... H01L 25/0753 257/88 |
| 2015/0034996 | A1* | 2/2015 | Chao ....................... H01L 33/62 257/99 |
| 2015/0064816 | A1* | 3/2015 | Wei .................... H01L 21/02521 438/22 |
| 2015/0214454 | A1* | 7/2015 | Hsu ........................ H01L 24/24 257/99 |
| 2015/0255675 | A1* | 9/2015 | Song ...................... H01L 33/382 257/99 |
| 2015/0318443 | A1* | 11/2015 | Suh ........................ H01L 27/15 257/76 |
| 2016/0049387 | A1* | 2/2016 | Schubert ............. H01L 25/0753 257/88 |
| 2017/0077352 | A1* | 3/2017 | Kondo .................... H01L 33/38 |
| 2017/0079102 | A1* | 3/2017 | Simin .................... H01L 33/20 |
| 2017/0098738 | A1* | 4/2017 | Wang ..................... H01L 33/38 |
| 2017/0194531 | A1* | 7/2017 | Huang .................. H01L 33/145 |
| 2017/0222108 | A1 | 8/2017 | Chang et al. |
| 2017/0338380 | A1* | 11/2017 | Lee .................... H01L 33/0079 |
| 2018/0122788 | A1 | 5/2018 | Wu et al. |
| 2018/0122836 | A1* | 5/2018 | Kang ................... H01L 33/505 |
| 2018/0122837 | A1* | 5/2018 | Kang ................... H01L 27/124 |
| 2018/0174519 | A1* | 6/2018 | Kim ..................... G09G 3/3233 |
| 2018/0175268 | A1* | 6/2018 | Moon .................... H01L 33/62 |
| 2018/0287015 | A1* | 10/2018 | Wang .................... H01L 33/32 |
| 2018/0315887 | A1* | 11/2018 | Choi ..................... H01L 33/12 |

FOREIGN PATENT DOCUMENTS

| | | |
|---|---|---|
| CN | 104465902 | 3/2015 |
| CN | 104485405 | 4/2015 |
| CN | 105374910 | 3/2016 |
| CN | 105742451 | 7/2016 |
| TW | 201037870 | 10/2010 |
| TW | I453951 | 9/2014 |
| TW | I479687 | 4/2015 |
| TW | I584491 | 5/2017 |

* cited by examiner

LIGHT EMITTING DEVICE WITH A STEPPED STRUCTURE

CROSS-REFERENCE TO RELATED APPLICATION

This application claims the priority benefit of Taiwan application serial no. 106129200, filed on Aug. 28, 2017. The entirety of the above-mentioned patent application is hereby incorporated by reference herein and made a part of this specification.

BACKGROUND OF THE INVENTION

1. Field of the Invention

The invention relates to a light emitting device, and particularly relates to a light emitting device having a stepped structure.

2. Description of Related Art

With advantages such as long life time, small volume, high shock resistance, low heat output, and low power consumption, LEDs have been widely used in indicators or light sources of a variety of household electric appliances and instruments. In recent years, LEDs have been developed toward multicolor and high brightness; therefore, its application scope has been expanded to large outdoor display boards, traffic signal lights, and the like. In the future, LEDs may even become the main illumination light source with both power-saving and environment-protecting functions.

Thus, how to further increase light emitting efficiency of LEDs has become an issue to work on.

SUMMARY OF THE INVENTION

The invention provides a light emitting device having a desirable light extraction efficiency.

The invention provides a light emitting device having a desirable light emitting efficiency.

The invention provides a light emitting device including a first semiconductor layer, a light emitting layer, a second semiconductor layer, a first electrode, and a second electrode. The light emitting layer is disposed on the first semiconductor layer. The second semiconductor layer is disposed on the emitting layer. The first electrode is electrically connected with the first semiconductor layer. The second electrode is electrically connected with the second semiconductor layer. The first semiconductor layer, the light emitting layer and the second semiconductor layer form a stepped structure including a first electrode connection surface, a second electrode connection surface, and a connection portion. The first electrode connection surface is located on the first semiconductor layer. The second electrode connection surface is located on the second semiconductor layer. The connection portion connects the first electrode connection surface and the second electrode connection surface. The connection portion at least includes a first surface, a second surface, and a third surface. A first corner is formed between the first and the second surfaces. A second corner is formed between the second and the third surfaces.

Based on the above, the light emitting device according to the embodiments of the invention has the stepped structure. Accordingly, the light extraction efficiency is increased, and the light emitting efficiency of the light emitting device is thus increased.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 3A is a schematic top view illustrating the light emitting device according to the first embodiment of the invention.

DESCRIPTION OF THE EMBODIMENTS

Figure 1A:
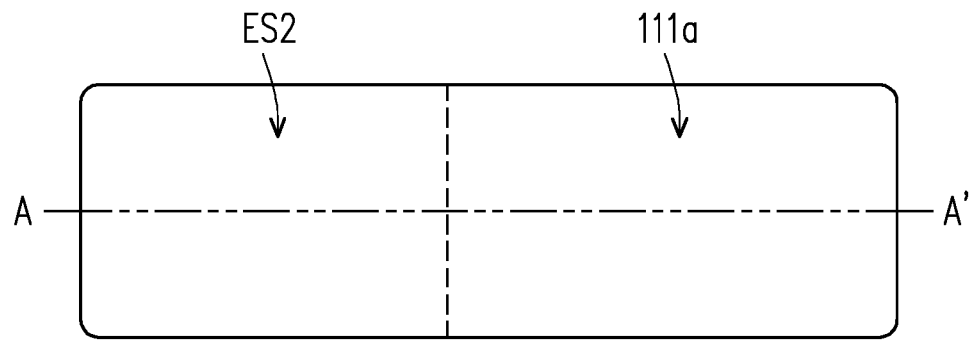
FIGS. 1A, 2A, and 3A are sequentially schematic top views illustrating a manufacturing process of a light emitting device according to a first embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
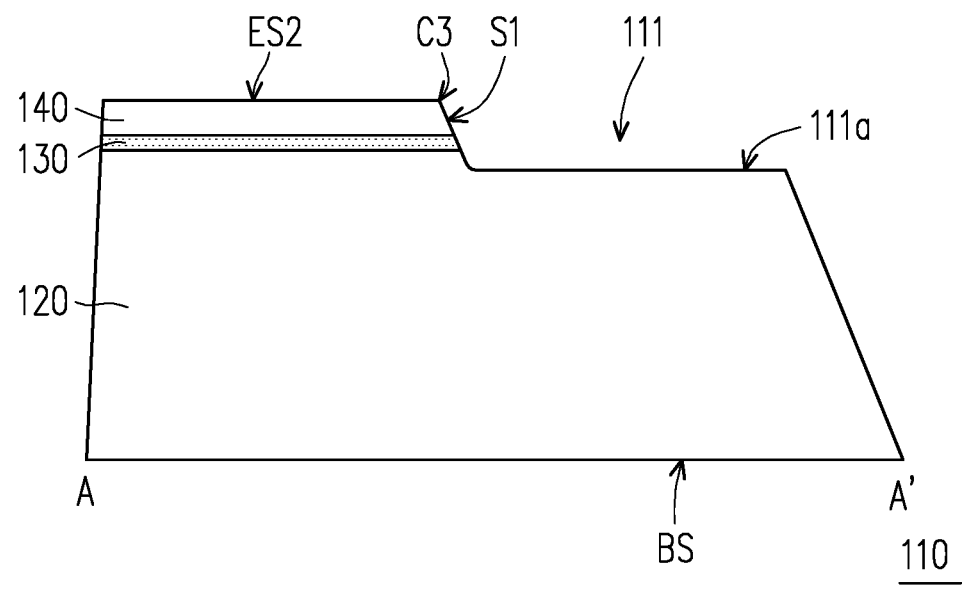
FIG. 1B is a schematic cross-sectional view illustrating the manufacturing process of the light emitting device of FIG. 1A along a cross-sectional line A-A'.
Figure 2A:
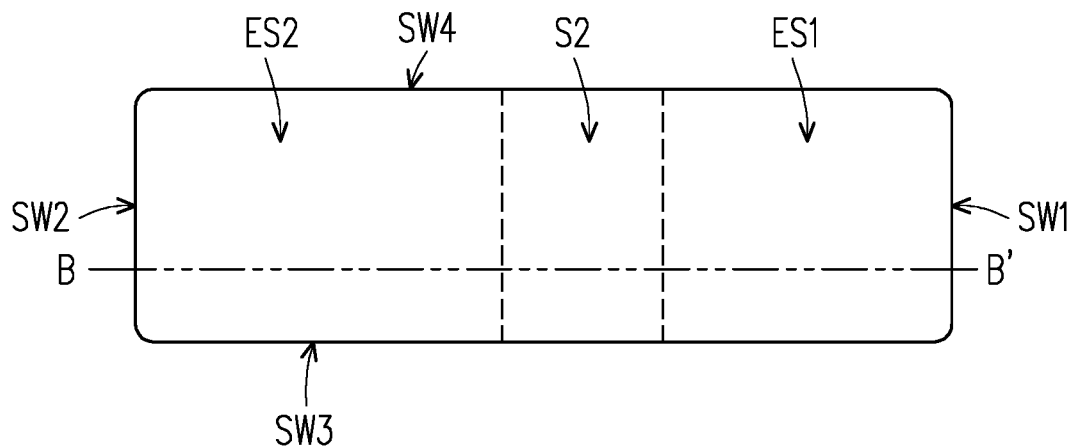
Figure 2B:
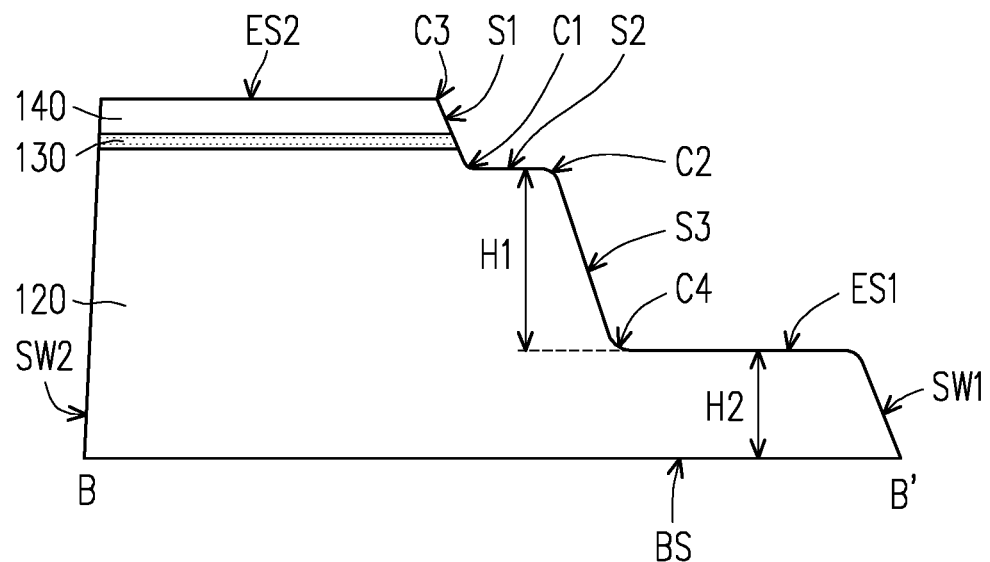
FIG. 2B is a schematic cross-sectional view illustrating the manufacturing process of the light emitting device of FIG. 2A along a cross-sectional line B-B'.
Figure 2C:
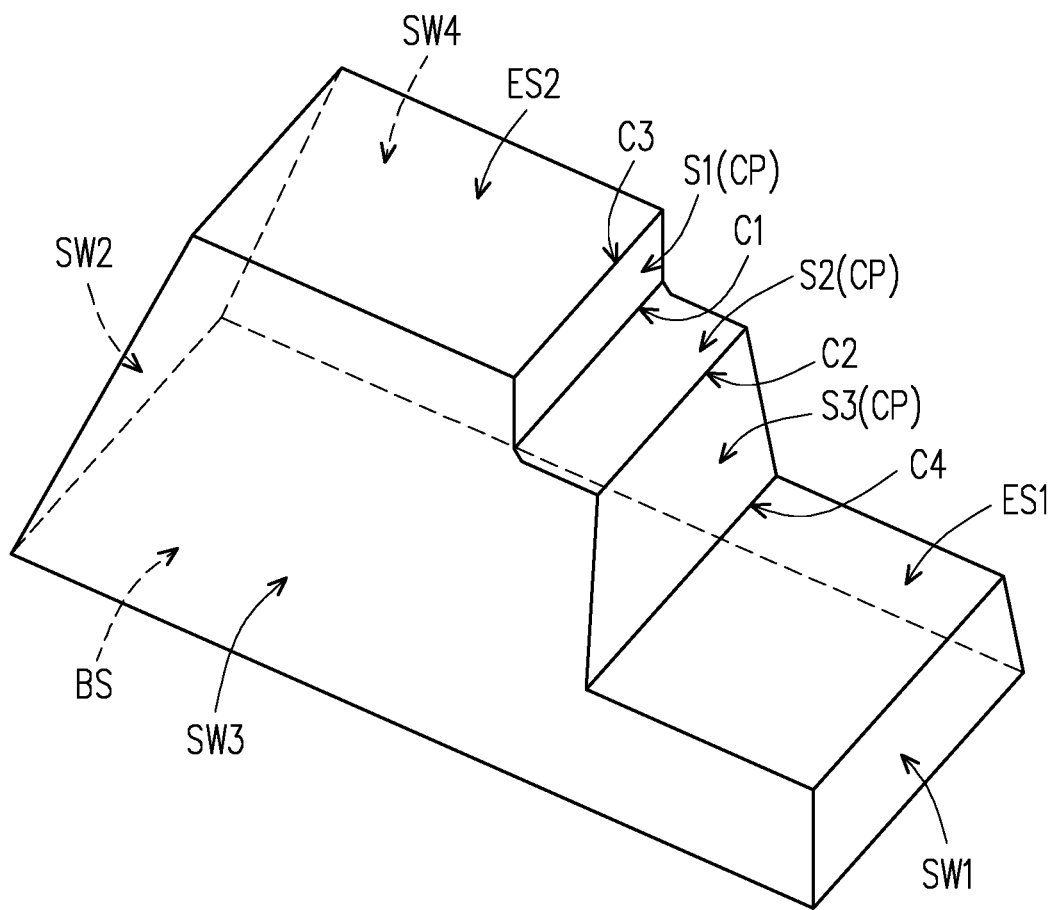
FIG. 2C is a schematic perspective view illustrating a stepped structure of FIG. 2A.
Figure 3A:
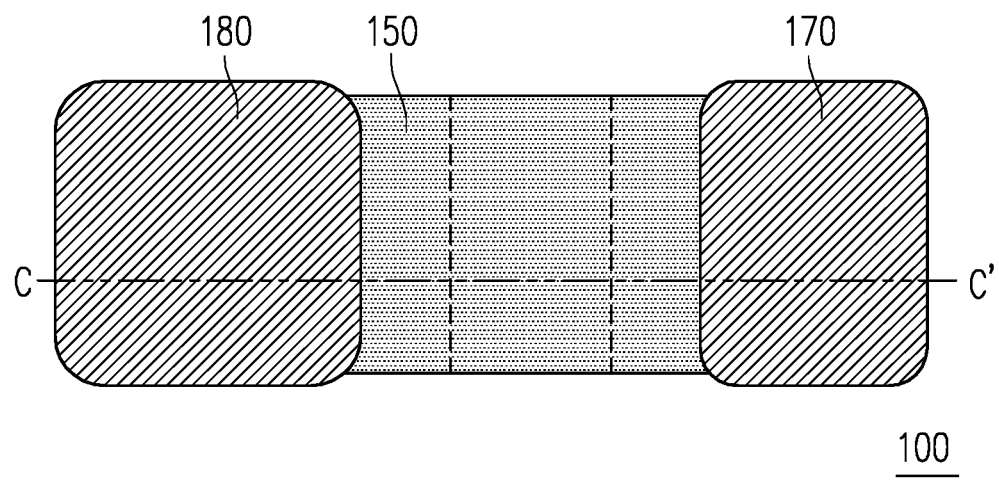
Figure 3B:
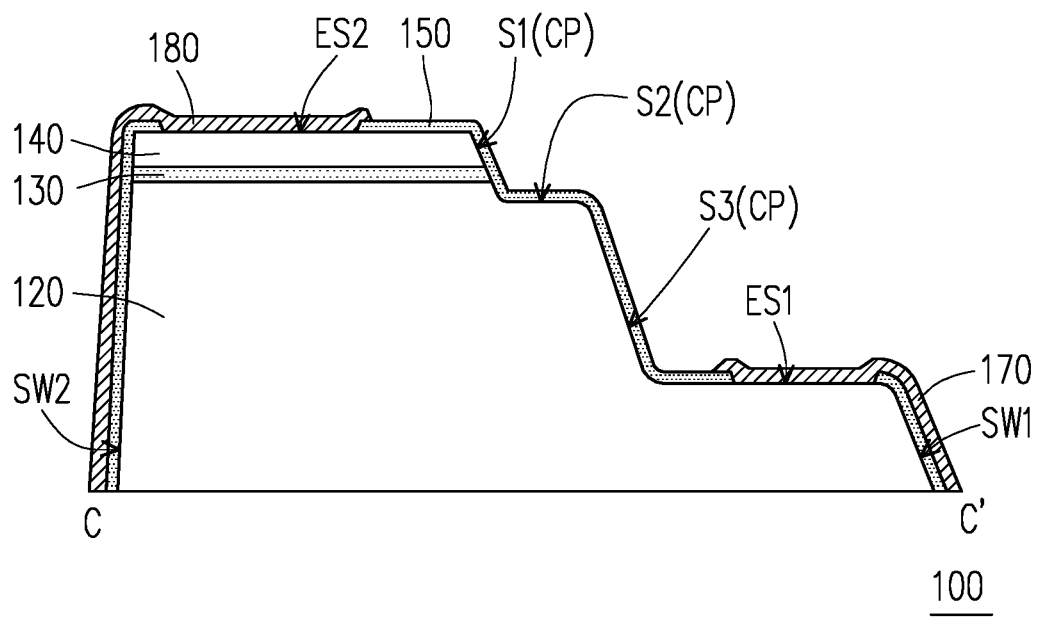
FIG. 3B is a schematic cross-sectional view illustrating the light emitting device of FIG. 3A along a cross-sectional line C-C'.
Figure 3C:
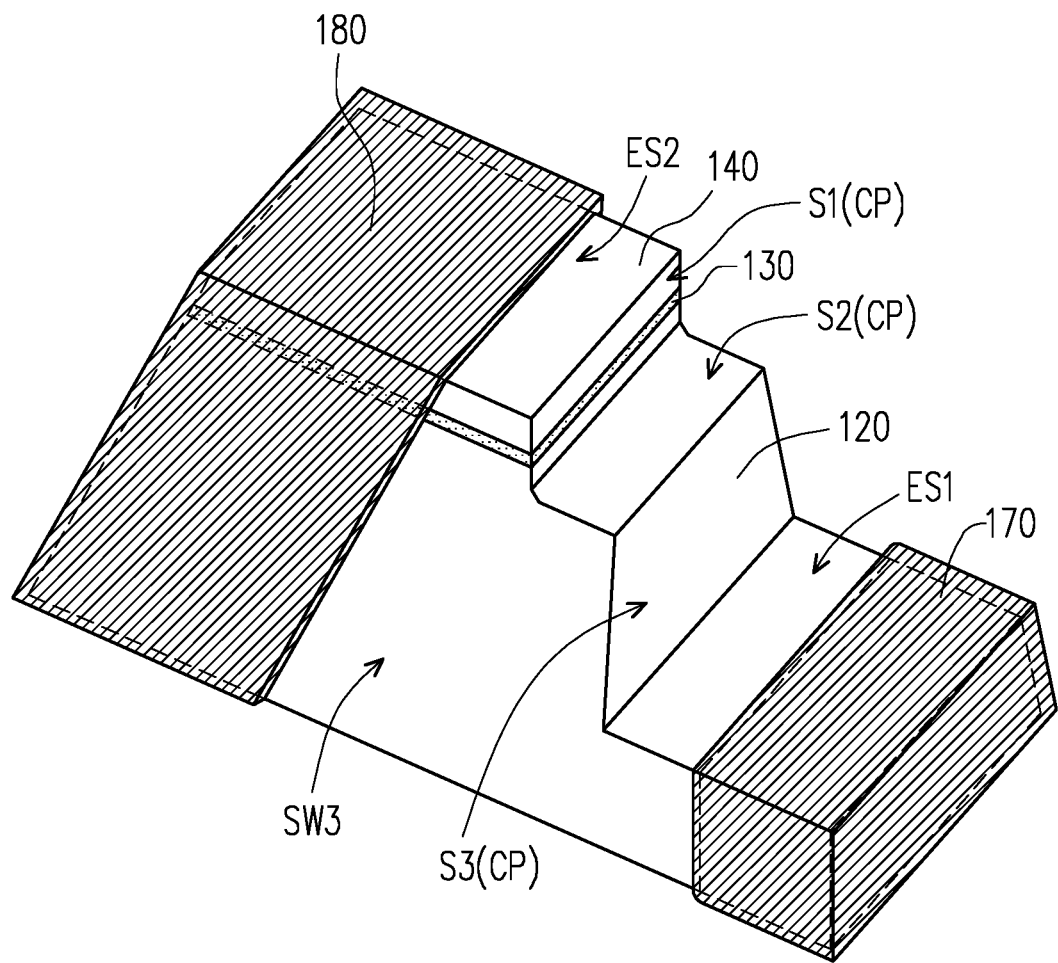
FIG. 3C is a schematic perspective view illustrating the light emitting device of FIG. 3A.

FIGS. 1A, 2A, and 3A are sequentially schematic top views illustrating a manufacturing process of a light emitting device according to a first embodiment of the invention. FIG. 3A is a schematic top view illustrating the light emitting device according to the first embodiment of the invention. FIG. 1B is a schematic cross-sectional view illustrating the manufacturing process of the light emitting device of FIG. 1A along a cross-sectional line A-A'. FIG. 2B is a schematic cross-sectional view illustrating the manu-facturing process of the light emitting device of FIG. 2A along a cross-sectional line B-B'. FIG. 2C is a schematic perspective view illustrating a stepped structure of FIG. 2A. FIG. 3B is a schematic cross-sectional view illustrating the light emitting device of FIG. 3A along a cross-sectional line C-C'. FIG. 3C is a schematic perspective view illustrating the light emitting device of FIG. 3A. For the ease of illustration, some layers are omitted in FIG. 3C.

First, referring to FIGS. 1A and 1B, a base material 110 is provided. The base material 110 has a bottom surface BS, a second electrode connection surface ES2 opposite to the bottom surface BS, and a recess 111 located on the same side with the second electrode connection surface ES2. The recess 111 is recessed from the second electrode connection surface ES2 toward the bottom surface BS, and includes a first surface S1 and a recessed surface 111a. The first surface 111 is connected with the second electrode connection surface ES2. In addition, a third corner C3 that is protruded is formed between the second electrode connection surface ES2 and the first surface S1. In other words, an extending direction of the second electrode connection surface ES2 is substantially different from an extending direction of the first surface S1. The third corner C3 may be an interface or a curved interface surface between the second electrode connection surface ES2 and the first surface S1.

The base material 110 includes a first semiconductor layer 120, a light emitting layer 130, and a second semiconductor layer 140. The light emitting layer 130 is located between the first semiconductor layer 120 and the second semiconductor layer 140. In the embodiment, the second electrode connection surface ES2 of the base material 110 is located on the second semiconductor layer 140. In addition, the recessed surface 111a of the recess 111 is located on the first semiconductor layer 120. However, it should be noted that the invention is not limited thereto. In other embodiments, the second electrode connection surface ES2 of the base material 110 and the recessed surface 111a of the recess 111 may be located on the second semiconductor layer 140.

In the embodiment, the first semiconductor layer 120 is an N-type semiconductor layer, and the second semiconductor layer 140 is a P-type semiconductor layer. However, the invention is not limited thereto. In other embodiments, the first semiconductor layer 120 may be a P-type semiconductor layer, and the second semiconductor layer 140 may be an N-type semiconductor layer. A material of the N-type semiconductor layer includes n-GaN doped by a Group IVA element (such as Si), for example, and a material of the P-type semiconductor layer includes a p-GaN doped by a Group IIA element (such as Mg), for example. The light emitting layer 130 includes a multiple quantum well (MQW) structure, for example. The MQW structure includes a plurality of quantum well layers and a plurality of quantum barrier layers that are repetitively and alternately arranged. More specifically, a material of the light emitting layer 130 includes a plurality of InGaN layers and a plurality of GaN layers that are alternately stacked, for example. By designing a proportion of In or Ga in the light emitting layer 130, the light emitting layer 130 may emit light in different wavelength ranges. The first semiconductor layer 120, the light emitting layer 130, and the second semiconductor layer 140 may be formed by metal-organic chemical vapor deposition (MOCVD), for example. It should be noted that the material and the formation process of the first semiconductor layer 120, the light emitting layer 130, or the second semiconductor layer 140 described herein are merely examples and shall not be construed as limitations on the invention.

Referring to FIGS. 1A to 2C, an etching process may be performed on a portion of the recessed surface 111a, so that a stepped structure LS is formed in the base material BS. For example, $BCl_3$ and/or $Cl_2$ may be adopted as an etchant gas, and a portion of the recessed surface 111a away from the first surface S1 may be etched by performing a reactive-ion etching (RIE) process. Accordingly, a portion of the recess 111 away from the first surface S1 may be further recessed toward the bottom surface BS, and the stepped structure LS is thus formed in the base material 110.

In the embodiment, the first semiconductor layer 120, the light emitting layer 130, and the second semiconductor layer 140 form the stepped structure LS. The stepped structure LS includes a first electrode connection surface ES1, the second electrode connection surface ES2, and a connection portion CP. The connection portion CP connects the first electrode connection surface ES1 and the second electrode connection surface ES2. In other words, the first electrode connection surface ES1, the connection portion CP, and the second electrode connection surface ES2 form a continuous surface opposite to the bottom surface BS. Sequentially, the connection portion CP at least includes the first surface S1, a second surface S2, and a third surface S3 in an extending direction from the second electrode connection surface ES2 toward the first electrode connection surface ES1. The first surface S1 is connected with the second surface S2, and the extending direction of the first surface S1 is substantially different from the extending direction of the second surface S2. In addition, a first corner C1 that is recessed is formed between the first surface S1 and the second surface S2. The second surface S2 is connected with the third surface S3, and the extending direction of the second surface S2 is substantially different from the extending direction of the third surface S3. In addition, a second corner C2 that is protruded is formed between the second surface S2 and the third surface S3. The third surface S3 is connected with the first electrode connection surface ES1, and the extending direction of the third surface S3 is substantially different from the extending direction of the first electrode connection surface ES1. In addition, a fourth corner C4 that is recessed is formed between the third surface S3 and the first electrode connection surface ES1.

In generally, light emitting efficiency of the light emitting device 100 is also referred to as external quantum efficiency (EQE) defined as a product of multiplication of internal quantum efficiency (IQE) of the light emitting device 100 with light extraction efficiency of the light emitting device 100. The IQE of the light emitting device 100 is equivalent to photoelectric conversion efficiency of the light emitting device 100, and is mainly related to inherent properties of the light emitting device 100, such as energy band, defect, doped concentration, and/or epitaxial properties of the first semiconductor layer 120, the light emitting layer 130, and/or the second semiconductor layer 140. The light extraction efficiency of the light emitting device 100 refers to the number of photons measurable outside the light emitting device 100 after the photons generated inside the light emitting device 100 through photoelectric conversion undergo absorption, refraction, and reflection of the light emitting device 100. In other words, the light extraction efficiency of the light emitting device 100 is related to properties of the light emitting device 100 such as geometric structure and/or light extraction area. In other words, light extraction efficiency of the light emitting device 100 according to the embodiments of the invention can be increased at least by the first surface S1, the second surface S2, and the third surface S3 of the stepped structure LS, and the light emitting efficiency of a light emitting diode is consequently increased.

From another perspective, in the embodiment, the light emitting efficiency of the light emitting device 100 is increased by increasing the light extraction efficiency of the light emitting device 100 through the first surface S1, the second surface S2, and the third surface S3 of the stepped structure LS without adjusting conditions such as energy band, defect, doped concentration, and/or epitaxial properties (i.e., the IQE) of the first semiconductor layer 120, the light emitting layer 130, and/or the second semiconductor layer 140. In other embodiments, the light emitting efficiency of the light emitting device 100 may be further increased by increasing the IQE of the light emitting device 100 in addition to increasing the light extraction efficiency of the light emitting device 100 via the first surface S1, the second surface S2, and the third surface S3 configuring in the stepped structure LS.

In the embodiment, the stepped structure LS further includes a first sidewall SW1, a second sidewall SW2, a third sidewall SW3, a fourth sidewall SW4, and the bottom surface BS. The bottom surface BS of the stepped structure LS may be the bottom surface BS of the base material 110. The first sidewall SW1 and the second sidewall SW2 are located at two opposite sides of the stepped structure LS. The first sidewall SW1 is connected with the first electrode connection surface ES1 and the bottom surface BS. The second sidewall SW2 is connected with the second electrode connection surface ES2 and the bottom surface BS. The third sidewall SW3 and the fourth sidewall SW4 are located at other two opposite sides of the stepped structure LS. The third sidewall SW3 is connected with the first sidewall SW1, the second sidewall SW2, the first electrode connection surface ES1, the second electrode connection surface ES2, the first surface S1, the second surface S2, the third surface S3, and the bottom surface BS. The fourth sidewall SW4 is connected with the first sidewall SW1, the second sidewall SW2, the first electrode connection surface ES1, the second electrode connection surface ES2, the first surface S1, the second surface S2, the third surface S3, and the bottom surface BS.

In an embodiment, a first height H1 is set between the second surface S2 and the first electrode connection surface ES1, and a second height H2 is set between the first electrode connection surface ES1 and the bottom surface BS. In addition, the first height H1 is greater than the second height H2. Hence, a surface area of the third surface S3 is increased, thereby increasing the light extraction efficiency of the light emitting device 100. Consequently, the light emitting efficiency of the light emitting device 100 is further increased.

Referring to FIGS. 2A to 3C, after the stepped structure LS is formed, a patterned insulation layer 150 is formed on the stepped structure LS. In an embodiment, an insulation material layer is formed by performing a chemical vapor deposition (CVD) process. The insulation material layer includes a silicon nitride layer and/or a silicon oxide layer, for example. The insulation material layer may be patterned by performing an etching process, so as to form the patterned insulation layer 150. However, the invention is not limited thereto. The patterned insulation layer 150 is at least disposed on the second sidewall SW2 of the stepped structure LS to prevent a second electrode 180 formed subsequently from contacting the first semiconductor layer 120 and the light emitting layer 130. In the embodiment, the patterned insulation layer 150 may be further disposed on the first surface S1, the second surface S2, the third surface S3, a portion of the first electrode connection surface ES1, a portion of the second electrode connection surface ES2, the third sidewall SW3, the fourth sidewall SW4, and/or the first sidewall SW1. However, the invention is not limited thereto.

Referring to FIGS. 3A to 3C, after the patterned insulation layer 150 is formed, a first electrode 170 is formed on a portion of the first electrode connection surface ES1 and the first sidewall SW1, and the second electrode 180 is formed on a portion of the second electrode connection surface ES2 and the second sidewall SW2. In other words, the first electrode 170 is disposed on the first electrode connection surface ES1 and the first sidewall SW1, and the second electrode 180 is disposed on the second electrode connection surface ES2 and the second sidewall SW2. The semiconductor layer 120 is electrically connected with the first electrode 170, and the second semiconductor layer 140 is electrically connected with the second electrode 180. The patterned insulation layer 150 is located between the first semiconductor layer 120 and the second electrode 180.

In the embodiment, the first electrode 170 and the second electrode 180 do not cover the first surface S1 (shown in FIG. 2C), the second surface S2, and the third surface S3. Accordingly, the light extraction efficiency of the light emitting device 100 is increased, and the light emitting efficiency of the light emitting device 100 is thus increased. Nevertheless, it should be noted that the invention is not limited thereto. In other embodiments, the first electrode 170 and the second electrode 180 do not cover the first surface S1 and the second surface S2, and at least a portion of the third surface S3 is not covered. Accordingly, the light extraction efficiency of the light emitting device 100 is increased, and the light emitting efficiency of the light emitting device 100 is thus further increased.

In the embodiment, the first electrode 170 may be further disposed on a portion of the third sidewall SW3 and a portion of the fourth sidewall SW4. The second electrode 180 is further disposed on a remaining portion of the third sidewall SW4 and a remaining portion of the fourth sidewall SW4. The first electrode 170 and the second electrode 180 are structurally separated. In addition, the patterned insulation layer 150 is located between the first semiconductor layer 120 and the second electrode 180. More specifically, the first electrode 170 is further disposed to a portion of the third sidewall SW3 near the first sidewall SW1 and a portion of the fourth sidewall SW4 near the first sidewall SW1. In other words, the first electrode 170 disposed on a portion of the first electrode connection surface ES1, the first sidewall SW1, a portion of the third sidewall SW3 and a portion of the fourth sidewall SW4 exhibits a continuous structure. The second electrode 180 is further disposed to a portion of the third sidewall SW3 near the second sidewall SW2 and a portion of the fourth sidewall SW4 near the second sidewall SW2. In other words, the second electrode 180 disposed on a portion of the second electrode connection surface ES2, the second sidewall SW2, a portion of the third sidewall SW3 and a portion of the fourth sidewall SW4 exhibits a continuous structure.

In the embodiment, the first electrode 170 and the second electrode 180 are formed by firstly forming a conductive layer by performing a physical vapor deposition (PVD) process or a similar process, and then patterning the conductive layer by performing a photolithography and etching process. In other embodiments, the first electrode 170 and the second electrode 180 may also be formed by performing a screen printing process on a silver paste. It should be noted that the invention does not intend to impose a limitation on this regard.

With the processes, manufacturing of the light emitting device 100 according to the first embodiment of the invention is substantially completed. The light emitting device 100 includes the first semiconductor layer 120, the light emitting layer 130, the second semiconductor layer 140, and the first electrode 170, and the second electrode 180. The emitting layer 130 is disposed on the first semiconductor layer 120. The second semiconductor layer 140 is disposed on the emitting layer 130. The first electrode 170 is electrically connected with the first semiconductor layer 120. The second electrode 180 is electrically connected with the second semiconductor layer 140. The first semiconductor layer 120, the light emitting layer 130, and the second semiconductor layer 140 form the stepped structure LS including the first electrode connection surface ES1, the second electrode connection surface ES2, and the connection portion CP. The first electrode connection surface ES1 and the second surface S2 are located on the first semiconductor layer 120. The second electrode connection surface ES2 is located on the second semiconductor layer 140. The connection portion CP connects the first electrode connection surface ES1 and the second electrode connection surface ES2. The connection portion CP at least includes the first surface S1, the second surface S2, and the third surface S3. The third corner C3 that is protruded is formed between the second electrode connection surface ES2 and the first surface S1. The first corner C1 that is recessed is formed between the first surface S1 and the second surface S2. The second corner C2 that is protruded is formed between the second surface S2 and the third surface S3. The fourth corner C4 that is recessed is formed between the third surface S3 and the first electrode connection surface ES1.

In the embodiment, the light emitting device 100 may be a light emitting diode (LED) or a micro light emitting diode (μLED). However, the invention is not limited thereto.

Figure 4:
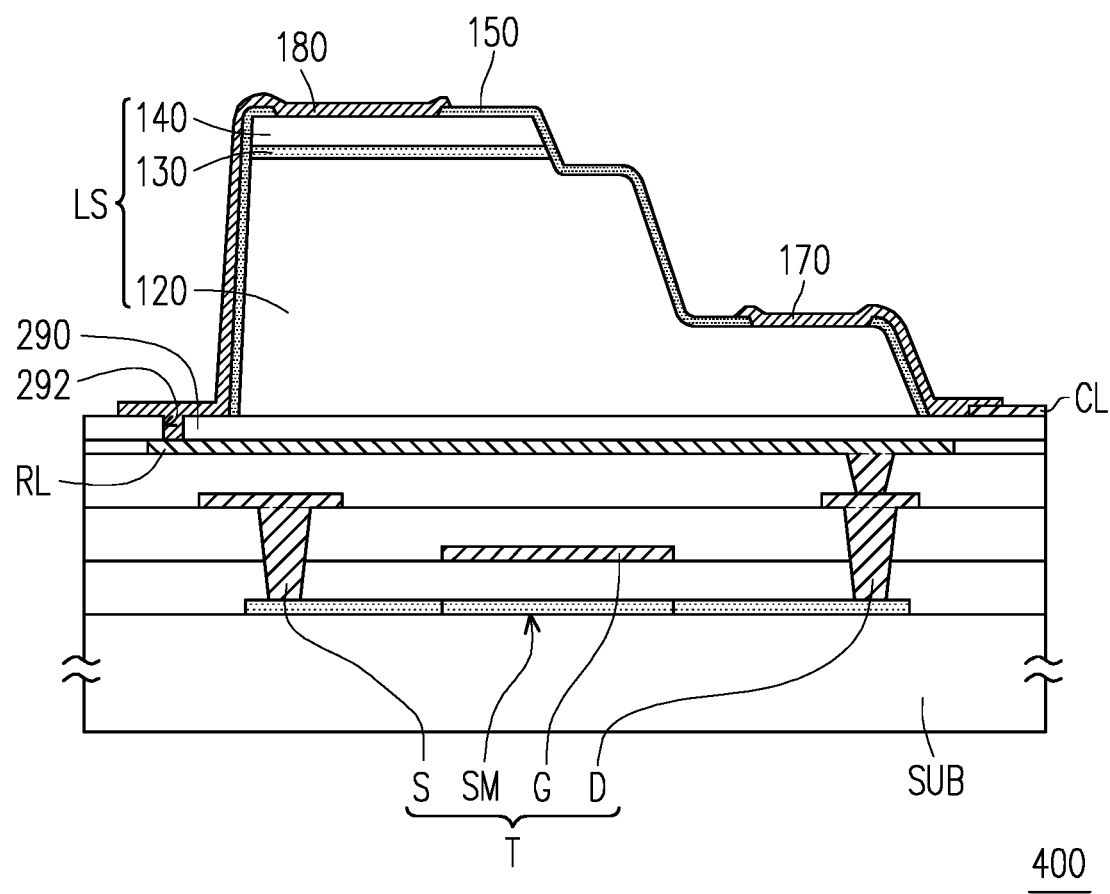
FIG. 4 is a schematic cross-sectional view illustrating a light emitting device according to a second embodiment of the invention.

FIG. 4 is a schematic cross-sectional view illustrating a light emitting device according to a second embodiment of the invention. It should be noted that the reference numerals and a part of the contents in the embodiment of FIGS. 1A to 3C are used in the embodiment of FIG. 4, in which identical reference numerals indicate identical or similar components, and repeated description of the same technical contents is omitted. For a detailed description of the omitted parts, reference can be found in the previous embodiment, and no repeated description is contained in the following embodiments.

Referring to FIG. 4, a light emitting device 400 of the embodiment may further include a substrate SUB, an active device T, and a common line CL.

In the embodiment, the stepped structure LS is disposed on the substrate SUB in an orientation where the first semiconductor layer 120 faces toward the substrate SUB. The active device T is disposed on the substrate SUB, and the second electrode 180 is electrically connected with the active device T. The first electrode 170 is electrically connected with the common line CL.

The active device T includes a source S, a drain D, a gate G, and a channel layer SM. The gate G is electrically connected with a scan line (not shown). The source S is electrically connected with a data line (not shown). The substrate SUB may be a glass substrate, a flexible substrate, an Si-based substrate, an organic polymer substrate, or other types of substrates. However, the invention is not limited thereto. In the embodiment, the active device T may be a low temperature poly Si thin film transistor (LTPS TFT). However, the invention is not limited thereto. In addition, considering electrical conductivity, the common line CL normally includes a metallic material. However, the invention is not limited thereto.

In the embodiment, the light emitting device 400 further includes an adhesive layer 290 and a through hole 292. The adhesive layer 290 is located between the active device T and the first semiconductor layer 120. The through hole 292 penetrates the adhesive layer 290. The second electrode 180 is electrically connected with the active device T through the through hole 292. A material of the adhesive layer 290 includes an epoxy resin, a photoresist, or silicone, for example. However, the invention is not limited thereto. In general, the through hole 292 may be formed on the adhesive layer 290 by performing a photolithography and etching process, a mechanical drilling process, or a laser drilling process. Regarding the manufacturing process, the stepped structure LS may be mounted onto the substrate SUB having the active device T by a micro-mechanical device or by performing a polydimethylsiloxane (PDMS) substrate transferring process, for example. In addition, the stepped structure LS is fixed on the substrate SUB through the adhesive layer 290.

In the embodiment, the second electrode 180 is further filled into the through hole 292. However, the embodiment is merely described herein as an example and the invention is not limited thereto. In other embodiments, another conductive material may be filled into the through hole 292 to electrically connect the second electrode 180 and the active device T.

In the embodiment, the light emitting device 400 further includes a reflective layer RL. The reflective layer RL is located between the active device T and the first semiconductor layer 120 and overlapped with the first semiconductor layer 120. In other words, in the embodiment, the light emitting device 400 exhibits a top emission design. In the embodiment, the reflective layer RL may include a conductive material. In addition, the reflective layer RL, the second electrode 180 and the active device T are electrically connected with each other. However, the invention is not limited thereto. In some embodiments, a material of the adhesive layer 290 may further include $TiO_2$ particles, so that the adhesive layer 290 is able to reflect light.

Figure 5:
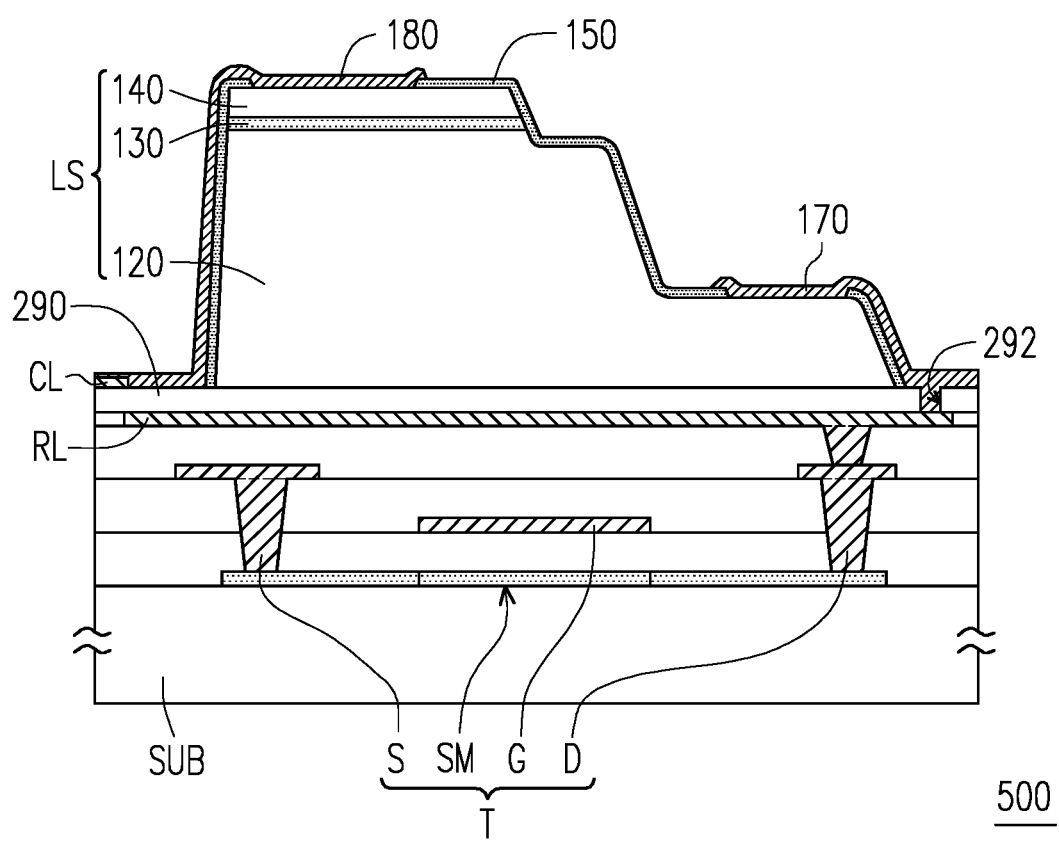
FIG. 5 is a schematic cross-sectional view illustrating a light emitting device according to a third embodiment of the invention.

FIG. 5 is a schematic cross-sectional view illustrating a light emitting device according to a third embodiment of the invention. It should be noted that the reference numerals and a part of the contents in the embodiment of FIG. 4 are used in the embodiment of FIG. 5, in which identical reference numerals indicate identical or similar components, and repeated description of the same technical contents is omitted. For a detailed description of the omitted parts, reference can be found in the previous embodiment, and no repeated description is contained in the following embodiments.

Referring to FIG. 5, a light emitting device 500 of the embodiment is similar to the light emitting device 400 of FIG. 4, but differs in that the first electrode 170 is electrically connected with the drain D, and the second electrode 180 is electrically connected with the common line CL.

Other designs may be applicable to the stepped structure LS in the light emitting devices 100, 400, and 500 of the foregoing embodiments. In the following, variations of the stepped structure are described with reference to FIGS. 6 and 7.

Figure 6:
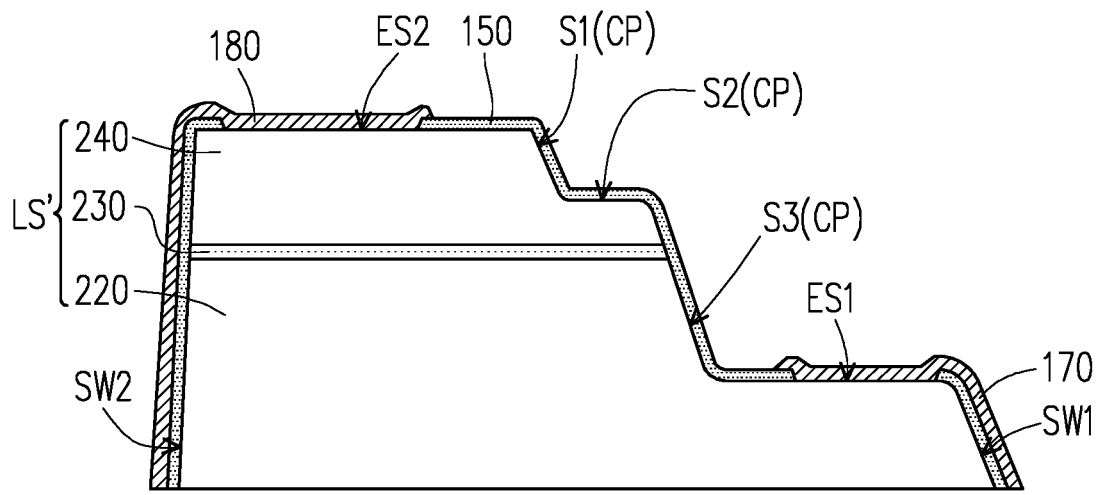
FIG. 6 is a schematic cross-sectional view illustrating a light emitting device according to a fourth embodiment of the invention.

FIG. 6 is a schematic cross-sectional view illustrating a light emitting device according to a fourth embodiment of the invention. It should be noted that the reference numerals and a part of the contents in the embodiment of FIGS. 1A to 3C are used in the embodiment of FIG. 6, in which identical reference numerals indicate identical or similar components, and repeated description of the same technical contents is omitted. For a detailed description of the omitted parts, reference can be found in the previous embodiment, and no repeated description is contained in the following embodiments.

Referring to FIG. 6, a light emitting device 600 of the embodiment is similar to the light emitting device 100 of FIGS. 3A to 3C, but differs in that a first semiconductor layer 220, a light emitting layer 230, and a second semiconductor layer 240 form a stepped structure LS'. The first electrode connection surface ES1 of the stepped structure LS' is located on the first semiconductor layer 220. The second electrode connection surface ES2 and the second surface S2 of the stepped structure LS' are located on the second semiconductor layer 240.

Figure 7:
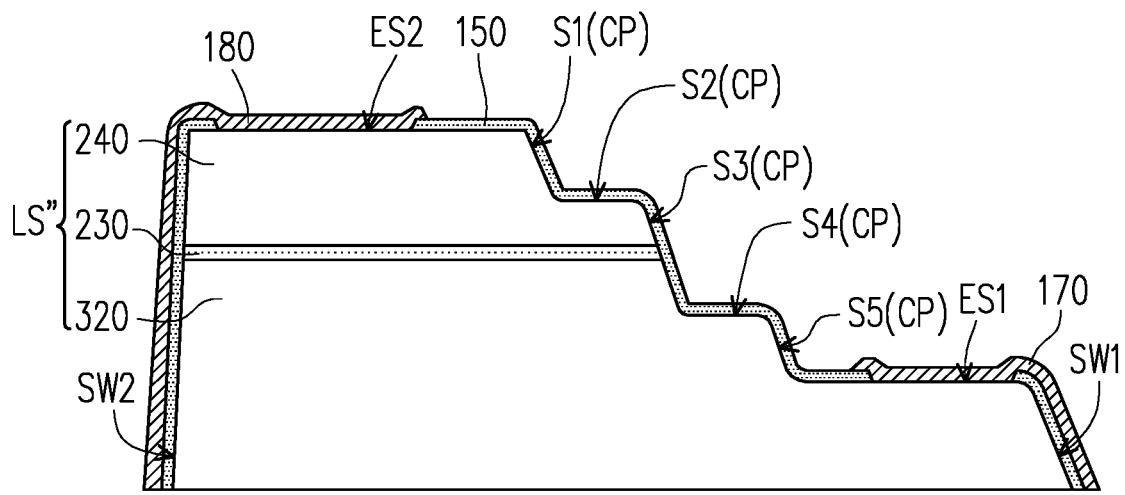
FIG. 7 is a schematic cross-sectional view illustrating a light emitting device according to a fifth embodiment of the invention.

FIG. 7 is a schematic cross-sectional view illustrating a light emitting device according to a fifth embodiment of the invention. It should be noted that the reference numerals and a part of the contents in the embodiment of FIG. 6 are used in the embodiment of FIG. 7, in which identical reference numerals indicate identical or similar components, and repeated description of the same technical contents is omitted. For a detailed description of the omitted parts, reference can be found in the previous embodiment, and no repeated description is contained in the following embodiments.

Referring to FIG. 7, a light emitting device 700 of the embodiment is similar to the light emitting device 600 of FIG. 6, but differs in that a first semiconductor layer 320, the light emitting layer 230, and the second semiconductor layer 240 form a stepped structure LS". The connection portion CP of the stepped structure LS" further includes a fourth surface S4 and a fifth surface S5. The first electrode connection surface ES1 and the fourth surface S4 of the stepped structure LS" are located on the first semiconductor layer 220. The second electrode connection surface ES2 and the second surface S2 of the stepped structure LS" is located on the second semiconductor layer 240.

Figure 8:
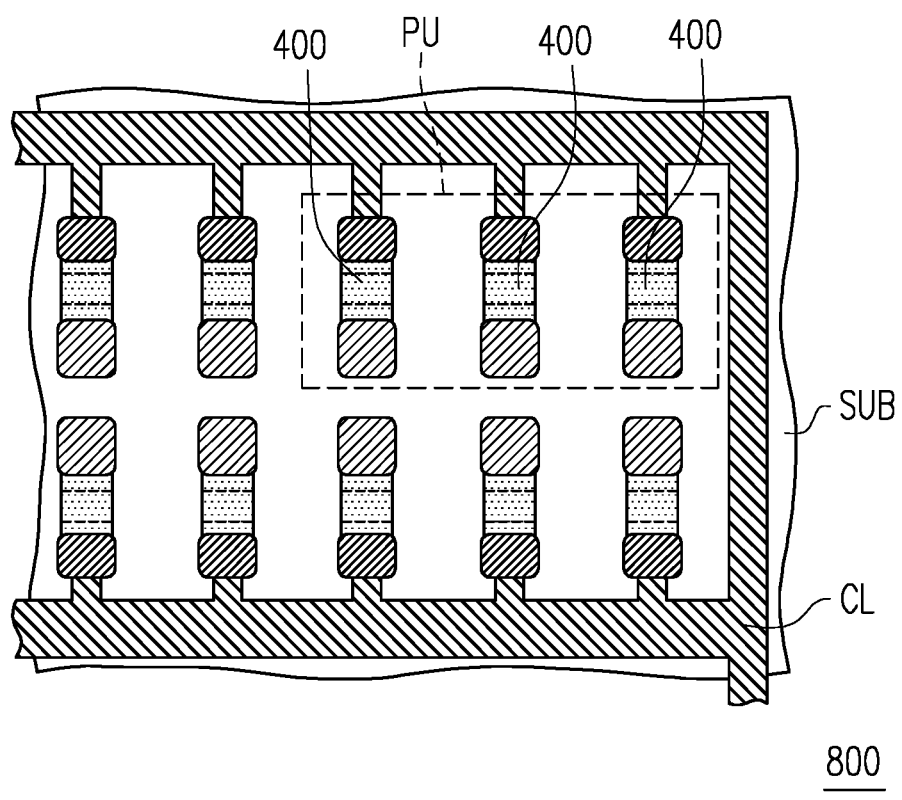
FIG. 8 is a schematic partial top view illustrating a display panel according to an embodiment of the invention.

FIG. 8 is a schematic partial top view illustrating a display panel according to an embodiment of the invention. In the embodiment, a display panel 800 may include a plurality of pixel units PU, and each of the pixel units PU may include a plurality of the light emitting devices 400. The common lines CL of the respective light emitting devices 400 may be electrically connected with each other to receive a common voltage (Vcom) output by a common voltage source. The respective light emitting devices 400 may emit light in the same or different colors. However, the invention is not limited thereto. The light emitting devices 400 in the pixel unit PU are arranged into rows. However, the invention is not limited thereto. In other embodiments, the light emitting devices 400 in the pixel unit PU may also be arranged into columns.

The light emitting devices in the display panel 800 of the embodiment are the light emitting devices 400. However, the light emitting devices 400 are only described herein as an example, and a plurality of structural designs may be adopted for the light emitting devices in the display panel 800. It should be noted that the invention does not intend to impose a limitation on this regard.

In view of the foregoing, the light emitting device according to the embodiments of the invention has the stepped structure. Accordingly, the light extraction efficiency of the light emitting device is increased, and the light emitting efficiency of the light emitting device is consequently increased. In addition, the display panel including the light emitting devices according to the embodiments of the invention has desirable light emitting efficiency.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A light emitting device, comprising:
a substrate;
a first semiconductor layer;
a light emitting layer, disposed on the first semiconductor layer;
a second semiconductor layer, disposed on the light emitting layer, wherein the first semiconductor layer, the light emitting layer, and the second semiconductor layer form a stepped structure disposed on the substrate, and the stepped structure comprises:
   a first electrode connection surface, located on the first semiconductor layer;
   a second electrode connection surface, located on the second semiconductor layer;
   a connection portion, connecting the first electrode connection surface and the second electrode connection surface and at least comprising a first surface, a second surface, and a third surface, wherein a first corner is formed between the first surface and the second surface, a second corner is formed between the second surface and the third surface, and an extending direction of the second surface is substantially different from an extending direction of the first surface and an extending direction of the third surface;
   a bottom surface;
   a first sidewall, connected with the first electrode connection surface and the bottom surface; and
   a second sidewall, connected with the second electrode connection surface and the bottom surface, wherein a first height between the second surface and the first electrode connection surface is greater than a second height between the bottom surface and the first electrode connection surface;
an active device, disposed on the substrate;
a common line, disposed on the substrate;
a first electrode, disposed on the first electrode connection surface and the first sidewall, wherein the first electrode is electrically connected with the first semiconductor layer; and
a second electrode, disposed on the second electrode connection surface and the second sidewall, wherein the second electrode is electrically connected with the second semiconductor layer; wherein:
   the first electrode is further electrically connected with the active device and the second electrode is further electrically connected with the common line; or
   the first electrode is further electrically connected with the common line and the second electrode is further electrically connected with the active device;
wherein a first distance between the second surface and the bottom surface is not equal to a second distance between the light emitting layer and the bottom surface; and the third surface is not covered by the first electrode.

2. The light emitting device as claimed in claim 1, wherein a third corner is formed between the first surface and the second electrode connection surface, and a fourth corner is formed between the third surface and the first electrode connection surface.

3. The light emitting device as claimed in claim 1, wherein the second surface is located on the first semiconductor layer.

4. The light emitting device as claimed in claim 1, wherein the second surface is located on the second semiconductor layer.

5. The light emitting device as claimed in claim 1, wherein:
   the first semiconductor layer is disposed between the substrate and the light emitting layer;
   the second electrode is electrically connected with the active device; and
   the common line is electrically connected with the first electrode.

6. The light emitting device as claimed in claim 5, further comprising:
   an adhesive layer, disposed between the active device and the first semiconductor layer; and
   a through hole, penetrating the adhesive layer, wherein the second electrode is electrically connected with the active device through the through hole.

7. The light emitting device as claimed in claim 1, wherein:
   the first semiconductor layer is disposed between the substrate and the light emitting layer;
   the first electrode is electrically connected with the active device; and
   the common line is electrically connected with the second electrode.

8. The light emitting device as claimed in claim 7, further comprising:
   an adhesive layer, disposed between the active device and the first semiconductor layer; and
   a through hole, penetrating the adhesive layer, wherein the first electrode is electrically connected with the active device through the through hole.

9. The light emitting device as claimed in claim 1, wherein the first electrode does not cover the second surface.

10. The light emitting device as claimed in claim 1, further comprising a patterned insulation layer disposed between the first semiconductor layer and the second electrode.

11. The light emitting device as claimed in claim 1, wherein the second surface is located on the first semiconductor layer, and a first distance between the second surface and the bottom surface is less than a second distance between the light emitting layer and the bottom surface.

12. The light emitting device as claimed in claim 1, wherein the second surface is located on the second semiconductor layer, and a first distance between the second surface and the bottom surface is greater than a second distance between the light emitting layer and the bottom surface.

13. The light emitting device as claimed in claim 1, wherein:
   the second surface is located on the second semiconductor layer; and
   the stepped structure further includes a fourth surface and a fifth surface, the fourth surface is connected with the third surface and the fifth surface, an extending direction of the fourth surface is substantially different from the extending direction of the third surface and an extending direction of the fifth surface, and the fourth surface and the first electrode connection surface are located on the first semiconductor layer.

* * * * *